Figure 1:
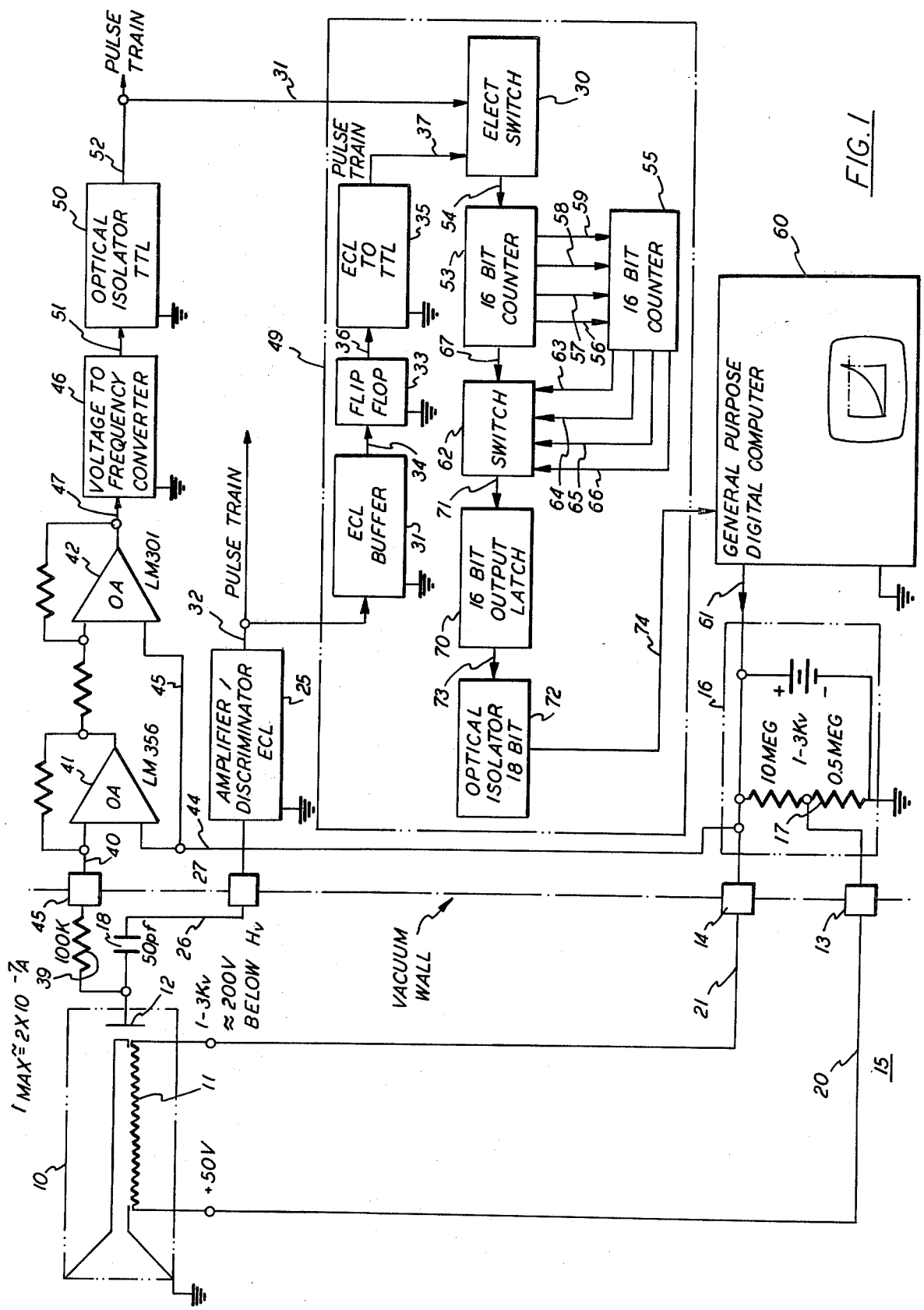

United States Patent [19]

Palmberg

[11] 4,335,304
[45] Jun. 15, 1982

[54] SIGNAL DETECTION MECHANISM FROM ELECTRON MULTIPLIER

[75] Inventor: Paul W. Palmberg, Minneapolis, Minn.

[73] Assignee: The Perkin-Elmer Corporation, Norwalk, Conn.

[21] Appl. No.: 174,022

[22] Filed: Jul. 31, 1980

[51] Int. Cl.³ ............................................. H01J 40/14
[52] U.S. Cl. ................................. 250/207; 250/214 R
[58] Field of Search ............. 250/207, 213 R, 213 VT, 250/551, 214 R, 310, 399; 313/103 R, 103 CM, 104, 105 R, 105 CM

[56] References Cited

U.S. PATENT DOCUMENTS

| 3,816,744 | 6/1974 | Chow | 250/207 |
| 4,070,578 | 1/1978 | Timothy et al. | 313/103 CM |
| 4,195,222 | 3/1980 | Fouilloy | 250/213 VT |

Primary Examiner—David C. Nelms
Attorney, Agent, or Firm—S. A. Giarratana; F. L. Masselle; R. A. Hays

[57] ABSTRACT

An electron multiplier, including an excitation means and collector, disposed in a high vacuum chamber and adapted to be coupled at its input to a charged particle analyzer is coupled through the vacuum chamber wall by a plurality of electrical feedthrough devices such that the excitation means is coupled to a high voltage power supply disposed outside the high vacuum chamber and the collector is coupled simultaneously through a capacitance coupling means and a resistance coupling means, both disposed within the high vacuum chamber, to an amplifier-discriminator and floating operational amplifier, respectively, both disposed outside the high vacuum chamber. The impedance offered by the capacitance coupling means is substantially lower than that offered by the resistance coupling to 10 nanosecond current pulses originating from single electron events. In the electron counting mode of operation the pulse signal from the amplifier-discriminator provides a measure of the input electron flux, but when the pulse count rate becomes extremely high, signal distortion due to pulse overlap occurs and a voltage-to-frequency converter driven by the operational amplifier means and an input-to-output electrical isolator provides an output signal from the analog mechanism representative of the input electron flux to the electron multiplier. Mechanism is also provided in the way of controlling the operation of the electron multiplier through a digital computer.

8 Claims, 2 Drawing Figures

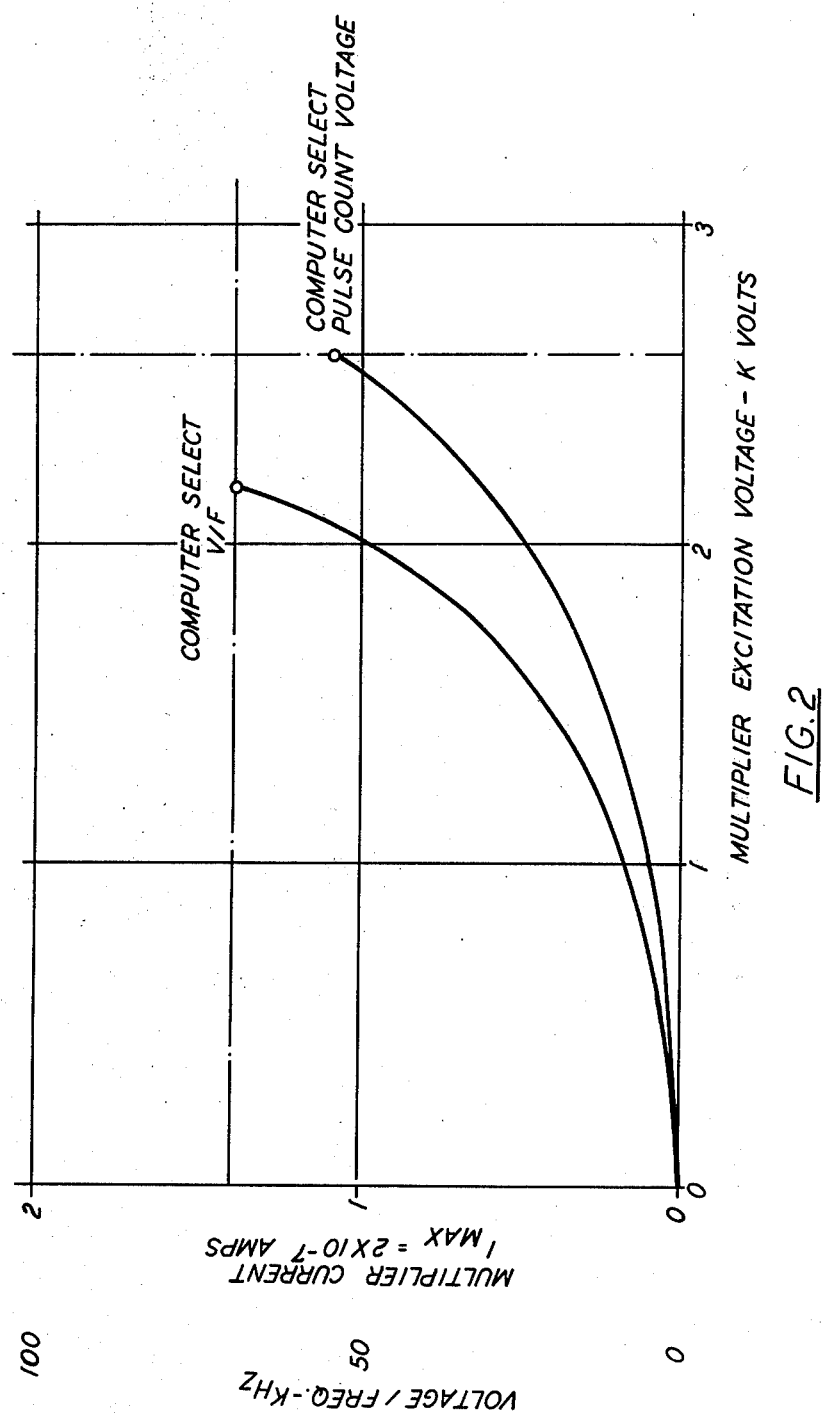

SIGNAL DETECTION MECHANISM FROM ELECTRON MULTIPLIER

This invention is directed to a means of measuring the output from an electron multiplier receiving emissions from an Auger Electron Analyzer and more particularly to a means of detection of the signals from the electron multiplier while operating in its normal range and in a range generally producing saturation.

Electron multipliers are used for detecting weak charged particle signals such as a stream of electrons passing through an electron spectrometer such as those received from an Auger Electron Spectrometer. The electron multiplier serves as a low noise amplifier which raises the signal level to a value sufficient for processing by conventional analog circuitry. The electron multiplier gain can be adjusted from a low value of a few hundred up to a gain of $10^8$ by varying the voltage across the excitation means of the multiplier. In a typical electron multiplier, in which the excitation voltage may be from two thousand to three thousand volts, an electron striking the interior coating or surface of the electron multiplier may produce a gain which is equal to approximately $10^6$ for each electron in. In other words, for each ion or electron impact at the entrance of a multiplier, a pulse of current arrives at the multiplier collector. Since the pulse width is typically no larger than $10^{-8}$ seconds, up to several million events per second can be detected without appreciable pulse overlap. For signal levels less than a few million counts per second (CPS), the output is normally applied to an amplifier-discriminator which amplifies and uniformly shapes each pulse which is greater in magnitude than the preset discriminator level. In this mode of operation, each charged particle entering the electron multiplier results in a precisely shaped pulse (either TTL or ECL) from the amplifier-discriminator that can be connected to some form of counter. This method of operation produces the advantage of a very low noise level since all noise spikes below the discriminator level are rejected. Additionally, each pulse is weighted equally, even though there is a significant distribution in the magnitude of pulses leaving the multiplier due to the statistical nature of the amplification process. That is, at signal beam currents below about $10^{-12}$ amperes, the preferred pulse count detection method can be used without saturating the electron multiplier. However, for higher beam currents it is necessary to reduce the multiplier excitation voltage and employ generally some form of analog detection. Thus the disadvantage of pulse counting in the manner just described is the limitation on the counting rate.

When the arrival rate of particles entering the electron multiplier exceeds a few million per second, it then becomes necessary to use analog detection equipment which is inherently an inferior method because no compensation is made for the pulse height distribution of the multiplier. Background noise also remains unrejected and thus adds noise to the signal.

In an Auger electron spectrometer, it is generally necessary to detect signals ranging well above and below a few million electron counts per second. Hence it is advantageous to employ both detection methods, depending on the signal level being obtained.

In the prior art the collector signal was brought through the vacuum wall by a high voltage feedthrough and coupled to ground potential through a high voltage capacitor. A relay or switch was used to direct the signal, either to an amplifier/discriminator or an analog amplifier. However, the prior art had several disadvantages which included having the vacuum feedthrough for the signal at a high potential which generally produced spurious counts due to microarcs from the feedthrough to ground, particularly in high humidity. Additionally, a large number of interfaces were present in the pulse count signal line which introduced noise that resulted in a higher background count and a necessity to operate the discriminator at a higher level that in turn required greater multiplier gain and consequently reduced the life of the electron multiplier. The prior art also required that the switch or relay be similarly actuated in an atmosphere in which the switch itself became a source of noise, and it was a particularly troublesome in a high humidity environment.

The present invention makes use of a circuit for detecting the pulse count and/or analog signal without any electronic switching and overcomes the above-mentioned problems by bringing the critical components inside the vacuum and providing simultaneous paths for each type of detector. In this invention, the pulse count signal is directed to the amplifier-discriminator from the electron multiplier collector through an ultra high vacuum compatable capacitor and vacuum feedthrough effectively eliminating arcs. That is, in passing the signal from the capacitor outwardly through the feedthrough, the vacuum feedthrough terminal is effectively at ground potential. By choosing the proper resistance value, the impedance to individual pulses of the alternate resistance path is several orders of magnitude greater than the capacitor path, and hence the pulse count signal is not appreciably attenuated by the alternate analog signal path through the resistor. The impedance of the analog resistor is made small compared with the capacitor path for frequencies up to 10 kHz. The analog signal may then be applied to a pair of floating operational amplifiers from the resistance path, with their output signal being digitized by a voltage-to-frequency converter, after which the signal is isolated to be used as a train of pulses.

It is therefore a general object of this invention to provide new and improved apparatus for use with an Auger electron actuated electron multiplier.

It is another object of this invention to provide an Auger electron analyzer that selectively converts the data through an amplifier-discriminator or through an analog counting mechanism.

It is a more specific object of this invention to provide an analog counting circuit that automatically is selected for operating in counting Auger electrons emitted even though the beam flux extends above several million counts per second.

It is yet another object of this invention to provide an Auger electron actuated electron multiplier mechanism that controls the multiplier excitation voltage to prevent the collector current from exceeding its inherent current limit.

These and other objects and advantages of the invention will more fully appear from the following description, made in connection with the accompanying drawings, wherein like reference characters refer to the same or similar parts throughout the several views, and in which:

FIG. 1 is a schematic diagram of my invention; and
FIG. 2 is a graphic illustration of the responsive limits of an electron multiplier.

A general description of the operation of an Auger electron spectrometer may be found in U.S. Pat. No. 3,461,306 issued to V. L. Stout et. al. Auger electrons may be used for determining the constituent materials of a sample being studied or examined by an irradiating electron beam. Upon bombarding a sample by electrons, ionization of the inner orbits of some of its atoms takes place and the occurence of one of two phenomena. X-rays may be produced when an electron makes the transistion from a higher energy level to the ionized inner orbit level. The second phenomenon is that the energy may be transferred to another of the higher level electrons, ejecting it from the atom without the emission of electromagnetic radiation and those electrons emitted by this process are called Auger electrons. Those electrons are detected by an electron multiplier 10 when the electron passes through a window opening into the electron multiplier. The electron multiplier may be of the type manufactured by Galileo Electro-Optics Corp. Galileo Park, Strubridge, Mass. under Model No. (SEM) 4200 series which uses a glass dynode structure in which voltage is applied across an excitation surface circuit 11, the voltage at the entrance being approximately 50 volts, the other end having a voltage of one to three kilovolts. Such a mechanism has a typical maximum electron gain of approximately $10^8$. Electron multiplier 10 has a collector 12 that is spaced immediately to the rear of the multiplier tube, and a positive bias of approximately 200 volts is applied thereto with respect to the end of the multiplier. That is, the end of the multiplier tube is approximately 200 volts below the high voltage applied to the collector, the excitation voltage being applied through feedthroughs 13 and 14 of the ultra high vacuum chamber indicated generally as numeral 15. A high voltage power supply 16 provides a high voltage of one to three thousand volts that is applied across a voltage divider 17. A lead 20 is connected through feedthrough 13 to the lower end of the voltage divider and the other end of the voltage divider is connected to the high voltage end of the multiplier tube by a connecting lead 21 that passes through feedthrough 14.

At incident beam currents below $10^{-12}$ amperes, the electrical signal from collector 12 is a series of sharp pulses which pass through the 50 pf, 5 kv capacitor 18 in the ultra high vacuum chamber and the signal is applied to an amplifier/discriminator 25 through electrical lead 26 and pass through 27. Amplifier/discriminator 25 may be of the type manufactured by SSR Instruments Co., 1001 Colorado Avenue, Santa Monica, Calif. and designated model 1120. That type of amplifier/discriminator permits resolving individual electron pulses that are separated by as little as $10^{-8}$ seconds with sufficient sensitivity to detect individual electron pulses. The output of amplifier/discriminator 25 is applied to a general purpose computer with means to count pulses for precise time intervals, as will be described subsequently.

When the electron multiplier receives pulses at such a high rate that the electron multiplier output current reaches its inherent current limit, the signal is detected through the alternate analog path. The current at the collector 12 is directed through a 100 kohm resistor 39 and is applied to a pair of operational amplifiers 41 and 42 through an input lead 40 and a vacuum feedthrough 43. Operational amplifiers 41 and 42 are connected to the high voltage point of voltage divider 17 through a pair of leads 44 and 45 respectively.

Operational Amplifiers 41 and 42 may be of the type manufactured by National Semiconductors Corporation of 2900 Semiconductor Drive, Santa Clara, Calif. and are designated models LM-356 and LM-301. They are general-purpose operational amplifiers and accept low input currents, making them well suited for long interval integrators.

The output of the pair of series-connected operational amplifiers is applied to a voltage-to-frequency converter 46 through a connecting lead 47. One such voltage-to-frequency converter is that manufactured by Analog Devices, Route 1, Industrial Park, P.O. Box 280, Norwood, Mass. Analog Devices makes a model AD 537 voltage-to-frequency converter that is driven by an operational amplifier and the output driver of the voltage-to-frequency converter provides a floating base drive to the power transistor. Stated in other terms, the voltage-to-frequency converter consists of an input amplifier, a precision oscillator system, an accurate internal reference generator and a high current square wave output state.

Because the output of the voltage-to-frequency converter is at a high potential, an isolator is desirable to bring the signal to an operating level consistent with other electronic circuits. An optical isolator 50 has its input driven from the output of voltage-to-frequency converter 46 through a lead 51 and the output is isolated, in one manner by the use of a device manufactured by Spectronics, a Division of Honeywell Inc., the optical isolator 50 being type SPX which includes an input-to-output isolation voltage of five thousand volts. Through the use of a LED transistorized output, the high voltages from the operational amplifier are disposed of and a pulse train is obtainable at the optical isolator output 52. That output also provides a pulse train to give a digital readout representative of the pulse rate being received by the electron multiplier. For certain applications, the pulse train which appears at the output of optical isolator 50 and amplifier/discriminator 25 may be used as a direct reading mechanism to convert the data so that a digital readout is obtainable.

To determine the optimum operating condition it is the best practice to increase the multiplier excitation voltage from a low value while monitoring the V/F output to ensure that the multiplier current does not exceed its saturation level. It is also desirable not to exceed the minimum multiplier excitation voltage required for pulse count detection since excess voltage results in more rapid multiplier degredation.

By reference to FIG. 2, it will be seen that a computer may be used to analyze the operating characteristics of the electron multiplier, select the proper operating voltage to ensure that the electron multiplier output current is not overdriven, and select the optimum detection mode. Such selection may be accomplished through the use of a general purpose digital computer 60 which is connected to the high voltage power supply 16 through the use of an operating line 61. The general purpose digital computer 60 may be of the type manufactured by Digital Equipment Corporation and designated DEC 11-04. Regardless of whether the analog mode of operation or the digital mode of operation is in use, the pulse train signals may be applied to a proper interface coupler 49. Interface coupler 49 is formed from a number of electronic components wherein an electronic switch 30 receives as one of its inputs, the pulse train that appears at the output 52 of optical isolator 50 through a connecting line 31. Electronic switch 30 may be of the type found in chip N7400 which includes a Two Input Positive Nand Gate. The output of amplifier-discriminator 25 in addition to supplying the pulse train supplies a signal to buffer 31 through a connecting lead 32. Buffer 31 may be of the type manufactured by Motorola Semiconductor Products, Inc. designated chip No. 1001. The 7400 series chip may be of the type manufactured by Signetics Corporation of Sunnyvale, Calif. or National Semiconductor Corporation. The output of buffer 31 is applied to a flip flop 33 through a signal lead 34. Flip flop 33 may be of the chip type designated by Motorola as number 1027. The output of the flip flop is applied to emitter-coupler logic to transistor-transistor logic converter 35 through a signal connecting line 36 and it in turn has its output applied to electronic switch 30 through a suitable signal lead 37. The converter 35 may be of the type manufactured by Motorola and designated chip No. 10125.

The output from electronic switch 30 is applied to a 16 bit counter 53 through a suitable signal lead 54. The 16 bit counter 53 is formed from a chip having four 4-bit binary counter configurations and may be of the type generally designated as chip No. 7493A. The output of 16 bit counter 53 is applied to another 16 bit counter 55 through suitable output connecting leads 56, 57, 58 and 59. Sixteen bit counter 55 is identical to that of 16 bit counter 53 and has its four outputs applied to an electronic switch 62 through four output connecting leads 63, 64, 65, and 66. Electronic switch 62 is a device having logic implementations of a 4-pole-two position switch with the position of the switch being set by the logic level supplied to the ones select input. The enable signal is supplied from 16 bit counter 53 through a connecting signal lead 67.

The output of electronic switch 62 is applied to a 16 bit output latch device 70 which is formed from two 8 bit latches and may be of the type designated chip No. 74116 and is of the type manufactured by Motorola. Latch 70 is connected to electronic switch 62 through suitable connecting means 71 and the output of latch 70 is applied to an 18 bit isolator 72 through suitable connecting means 73. The optical isolator 72 may be of the type manufactured by the Hewlett Packard Corporation and designated HCLP 2630. The output from the optical isolator 72 is directed through suitable connecting means 74 to a D.E.C. board that is part of computer 60 and is manufactured by the Digital Equipment Corporation.

Through the signal input on line 74, the computer 60 sets the electron multiplier voltage at a level most appropriate for the signal current from the material to be analyzed. The computer increases the multiplier excitation voltage from 0 while monitoring the pulse rate from the voltage-to-frequency converter. The operating curve is displayed on the terminal CRT, and if the operator selected voltage-to-frequency limit (in this case approximately 70 kHz) is reached before the pulse count voltage is reached, the multiplier voltage is set at a value corresponding to 70 kHz and the voltage-to-frequency detection mode is selected by the computer. If the preselected voltage for pulse counting is reached before the voltage-to-frequency limit of 70 kHz, pulse count detection is selected.

Thus through the teachings of the invention, the versatility of the electron multiplier is increased by providing a most convenient mechanism that will operate in a range that would normally cause problems of detection of the electron pulses, and without any electrical switching between components in the circuit. By adding the versatility of the digital computer, the detection mechanism is operable at its optimum operating point.

It will, of course, be understood that various changes may be in the form, details, arrangement and proportions of the parts, without departing from the scope of the invention which consists of the matter shown and described herein and set forth in the appended claims.

I claim:

1. An electron multiplier detection mechanism comprising:
   (a) a high-vacuum chamber having a plurality of electrical feedthrough devices disposed in a wall of said chamber;
   (b) an electron multiplier disposed within said high-vacuum chamber and adapted to be coupled at its input to the output of a charged particle analyzer, said electron multiplier including collector and excitation means;
   (c) floating operational amplifier means disposed outside said high-vacuum chamber;
   (d) a high voltage power supply disposed outside said high-vacuum chamber connected to the excitation means and collector of said electron multiplier through said plurality of electrical feedthrough devices, the voltage appearing at the excitation means being substantially lower than the voltage magnitude on the collector;
   (e) an amplifier-discriminator disposed outside said high-vacuum chamber to provide output data proportional to the pulse rate of said electron multiplier;
   (f) resistance coupling means disposed within said high-vacuum chamber coupling said collector to the input of said operational amplifier means through said plurality of electrical feedthrough devices;
   (g) capacitance coupling means disposed within said high-vacuum chamber coupling said collector to the input of said amplifier discriminator through said plurality of electrical feedthrough devices;
   (h) a voltage-to-frequency converter disposed outside said high-vacuum chamber operably connected to said operational amplifier means and providing an output signal having a frequency proportional to the voltage magnitude at the input;
   (i) and an input-to-output isolator disposed outside said high-vacuum chamber having its input operably connected to the output of said voltage-to-frequency converter and providing an electrically isolated output signal representative of the pulse rate of said electron multiplier.

2. The structure as set forth in claim 1 wherein said operational amplifier means includes at least a pair of series-coupled operational amplifiers.

3. The structure set forth in claim 1 wherein said input-to-output electrical isolator is an optical isolator.

4. The structure set forth in claim 1 wherein said resistance coupling means has an impedance substantially less than said capacitance coupling means at or below a frequency of 10 kHz, and an impedance much larger than the 50 pf capacitor at a frequency of 100 MHz.

5. The structure set forth in claim 1 including:
   (j) digital computer means programmed with the operational characteristics of said electron multiplier to limit the output current of said electron multiplier through the excitation voltage applied thereto, the operational characteristics including determination of the optimum output current of said electron-multiplier as a function of its excitation voltage for a given sample under test;

(k) and operable connecting means connecting said high voltage power supply to said digital computer means.

6. The structure set forth in claim 1 including:

(l) an interface coupler having a plurality of inputs, at least two of which receive pulse train signals from said amplifier discriminator and said input-to-output isolator, said interface coupler having an output signal representative of the pulse train signals as a function of the magnitude of the voltage from said high voltage power supply applied to the excitation means of said electron multiplier;

(m) digital computer means adapted to receive said pulse train signals and control the magnitude of said high voltage power supply;

(n) and operable connecting means connecting said high voltage power supply and said interface coupler to said digital computer means.

7. The structure set forth in claim 6 wherein said interface coupler includes:

(o) electronic counting means counting the pulse train signals from said analog detection circuit and said digital detection circuit to provide an output signal representative of the total of said pulse train signals.

8. The structure setforth in claim 6 wherein said interface coupler includes:

(p) logic converting means converting signals from one logic system to another to provide compatable signals for counting from a plurality of sources.

* * * * *

UNITED STATES PATENT AND TRADEMARK OFFICE
CERTIFICATE OF CORRECTION

PATENT NO. : 4,335,304

DATED : June 15, 1982

INVENTOR(S) : Paul W. Palmberg

It is certified that error appears in the above-identified patent and that said Letters Patent are hereby corrected as shown below:

Column 2, line 16, change "it was a particularly" to --it was particularly--.

Column 3, line 8, change "occurence" to --occurrence--.

Column 3, line 8, change "of one of" to --of one--.

Column 3, line 10, change "transistion" to --transition--.

Column 8, line 14, change "setforth" to --set forth--.

Signed and Sealed this

Twenty-first Day of September 1982

[SEAL]

Attest:

GERALD J. MOSSINGHOFF

Attesting Officer    Commissioner of Patents and Trademarks